(12) United States Patent
Bartsch et al.

(10) Patent No.: US 11,573,252 B2
(45) Date of Patent: Feb. 7, 2023

(54) METHOD FOR FEEDING ELECTRICAL POWER INTO AN ELECTRICAL SUPPLY NETWORK

(71) Applicant: Wobben Properties GmbH, Aurich (DE)

(72) Inventors: Matthias Bartsch, Bremen (DE); Christian Strafiel, Aurich (DE)

(73) Assignee: Wobben Properties GmbH, Aurich (DE)

( * ) Notice: Subject to any disclaimer, the term of this patent is extended or adjusted under 35 U.S.C. 154(b) by 182 days.

(21) Appl. No.: 17/077,704

(22) Filed: Oct. 22, 2020

(65) Prior Publication Data

US 2021/0123957 A1  Apr. 29, 2021

(30) Foreign Application Priority Data

Oct. 25, 2019  (DE) .......................... 102019128811.8

(51) Int. Cl.
  *G01R 19/25* (2006.01)
  *F03D 9/25* (2016.01)
  *F03D 7/04* (2006.01)

(52) U.S. Cl.
  CPC ......... *G01R 19/2513* (2013.01); *F03D 7/044* (2013.01); *F03D 9/255* (2017.02)

(58) Field of Classification Search
  CPC ...... G01R 19/2513; F03D 9/255; F03D 7/044
  See application file for complete search history.

(56) References Cited

U.S. PATENT DOCUMENTS

| 2010/0001527 A1 | 1/2010 | Fortmann et al. |
| 2010/0052322 A1* | 3/2010 | Fortmann ............. F03D 7/0272 290/44 |
| 2010/0276930 A1 | 11/2010 | Fortmann |

(Continued)

FOREIGN PATENT DOCUMENTS

| CA | 2300306 A1 | 2/1999 |
| DE | 19734722 A1 | 2/1999 |
| DE | 102007049251 A1 | 4/2009 |

(Continued)

*Primary Examiner* — Viet P Nguyen
(74) *Attorney, Agent, or Firm* — Seed Intellectual Property Law Group LLP

(57) ABSTRACT

A method for feeding electrical power into an electrical, three-phase supply network by means of an inverter device, wherein the electrical supply network has a three-phase line voltage with a first, second and third line voltage phase, comprising the steps: feeding the electrical power during normal operation if a fault-free operation has been identified for the electrical supply network, wherein during normal operation a positive sequence voltage and optionally a negative sequence voltage is recorded from the line voltage and a reactive current is specified at least depending on the positive sequence voltage and optionally depending on the negative sequence voltage, and changing to a fault operation if a voltage change in the line voltage meets a predetermined fault criterion, in particular if the voltage change exceeds a predeterminable minimum amount of change or a minimum amount of change gradient, wherein during the fault operation, at least directly after the change, the reactive current is specified depending on a space vector voltage.

16 Claims, 4 Drawing Sheets

(56) References Cited

U.S. PATENT DOCUMENTS

2016/0134121 A1  5/2016 Bartsch
2018/0219376 A1  8/2018 Strafiel et al.

FOREIGN PATENT DOCUMENTS

DE  102011121362 A1  6/2013
DE  102013210812 A1  12/2014
DE  102015112155 A1  1/2017
WO  2008/049541 A1  5/2008

* cited by examiner

METHOD FOR FEEDING ELECTRICAL POWER INTO AN ELECTRICAL SUPPLY NETWORK

BACKGROUND

Technical Field

The present disclosure relates to a method for feeding electrical power into an electrical, three-phase supply network by means of an inverter device. In particular, the present disclosure relates to a method of this type using a wind power installation. The disclosure also relates to a wind power installation with an inverter device for feeding electrical power into an electrical, three-phase supply network.

Description of the Related Art

Particularly wind power installations and photovoltaic installations, but also other decentralized feeding units regularly feed into the electrical supply network by means of one or a plurality of inverters. Usually, a plurality of inverters are used and together they can form an inverter device or a part thereof. Decentralized feeders of this type often also have to be able to feed reactive power into the electrical supply network. In this case, for the feed-in of reactive power, in terms of the method of the symmetrical components, provision can be made for a feed-in of the corresponding reactive current to take place in the positive and negative sequence, at least in the positive sequence. This can also be a requirement of the electrical supply network or its operator.

Determining the positive and negative sequence voltages in the electrical supply network is required for this purpose. A determination of this type of the positive and negative sequence voltages can be a relatively slow process, in any case when measured against the short reaction times which have to be partially maintained in the electrical supply network.

If the line voltage therefore changes, particularly as a result of an error, the determination of the positive and negative sequence voltages is in some cases not quick enough, so that this voltage change is not recorded sufficiently quickly or is still not recorded accurately enough after a short time. In particular, the positive and negative sequence voltage can frequently only be recorded over the duration of a period of the line voltage. In the case of a 50 Hz network, at least 20 ms are thus required in order to record the changes in the line voltage.

Correspondingly, the increase in the reactive current feed-in derived therefrom can also only take place comparatively slowly. Particularly in the case of a voltage-dependent reactive current feed-in, in the case of which the amplitudes of the reactive current fed in or the amplitudes of the reactive power fed in depend on the line voltage, the reactive power feed-in cannot track a voltage change quickly enough. In other words, it does occur that the increase in the reactive current feed-in derived from the line voltage takes place too slowly.

In the priority application the German Patent and Trade Mark Office searched the following prior art: DE 197 34 722 A1, DE 10 2015 112 155 A1 and CA 2 300 306 A1.

BRIEF SUMMARY

Techniques are to be proposed which, if possible, carries out a feed-in of a reactive current in the positive and negative sequence and nevertheless enables reactive power tracking as quickly as possible in the event of a quick voltage change in the line voltage.

A method is proposed for feeding electrical power into an electrical, three-phase supply network by means of an inverter device. In particular, the inverter device can comprise one or a plurality of inverters, or it can be an inverter. The inverter device is preferably part of a decentralized feeder, such as a wind power installation, a wind park or a photovoltaic installation.

The electrical supply network has a three-phase line voltage with a first, second and third line voltage phase. The feed-in method is thus adapted to this three-phase supply network. The three line voltage phases are considered together.

Provision is further made for the method to feed the electrical power during normal operation if a fault-free operation has been identified for the electrical supply network. During this normal operation, a positive sequence voltage and optionally a negative sequence voltage is recorded from the line voltage, and a reactive current is specified at least depending on the positive sequence voltage and optionally depending on the negative sequence voltage. A disassembly of the three-phase line voltage is thus proposed according to the method of symmetrical components. The result of a disassembly of this type is, in principle, a positive sequence component, a negative sequence component and an equal component. As is often the case, the equal component is also not important here, but rather the positive sequence component and the negative sequence component. In this case, it can be sufficient to consider the positive sequence component. However, an overall assessment of the three-phase line voltage is carried out in each case even if only the positive sequence component, i.e., the positive sequence voltage, is taken into account.

The reactive current, which is fed in depending on the positive sequence voltage, is thus also provided and fed in in three phases. In this case, the reactive current can depend on the positive sequence voltage to the extent to which its amplitude, in particular an effective value of the positive sequence voltage, is taken into account. In particular, a deviation of this amplitude from a reference voltage can be considered and, depending on this deviation, the amplitude of the reactive current to be fed in can be determined.

Furthermore, it is proposed to change to a fault operation if a voltage change in the line voltage meets a predetermined fault criterion. In particular if the voltage change exceeds a predeterminable minimum amount of change or minimum amount of change gradient. A fault operation is therefore explicitly taken into account. This can be identified and thus also defined by the fact that a voltage change in the line voltage meets a predetermined fault criterion. The line voltage is thus checked for the presence of a fault. A fault is particularly anticipated if the voltage change exceeds a predeterminable minimum amount of change. If the voltage change is thus greater than a predetermined threshold value, the fault operation is present. A rate of change, i.e., a change gradient of the voltage can also be considered instead of an absolute change. A minimum amount of change gradient can be used as a threshold for this purpose. In particular, a fault operation is present if the line voltage drops. By definition, normal operation is correspondingly present if no fault operation has been recorded or identified.

It is now proposed that during the fault operation, at least directly after the change from normal operation to the fault operation, the reactive current is specified depending on a space vector voltage.

A space vector voltage is familiar to the person skilled in the art and is also calculated from the three line voltage phases. In this case, a space vector voltage is a voltage vector rotating over time in the complex plane, which voltage vector can also be referred to as a space vector or space vector voltage. However, a space vector voltage of this type does not distinguish between a symmetrical and asymmetrical portion of the three line voltage phases.

In particular, it is proposed that the space vector voltage $\vec{u}$ is defined by the equation $$\vec{v} = \left[ v_1 + v_2 \exp\left(j\frac{2}{3}\pi\right) + v_3 \exp\left(j\frac{4}{3}\pi\right) \right],$$

with $v_1$, $v_2$ and $v_3$ each as an instantaneous value, in particular as an instantaneous measured value of the first, second and third line voltage phase respectively.

All three of the line voltage phases are therefore incorporated and a value of the space vector voltage can be calculated instantly from the three instantaneous values of the three line voltage phases. This means that the space vector voltage is available very quickly and can therefore supply a voltage value more quickly than the positive sequence voltage. The change therefore means changing from referencing the positive sequence voltage to referencing the space vector voltage for determining the reactive current.

It is therefore proposed that at least directly after the change from normal operation to the fault operation, referencing is changed to the space vector voltage. It has been particularly recognized here that the reactive power feed-in should react quickly to the fault, which can also be referred to as an error. The change of referencing is proposed for this purpose. After this quick reaction, there can be a change back to referencing the positive sequence voltage, even if the fault or the error persists. It has been particularly recognized that the transition is critical when the error occurs and a quick reaction is necessary. If the fault or the error persists, but without causing significant changes, referencing the positive sequence voltage can be sufficient or even more suitable.

According to an embodiment, it is proposed that the space vector voltage is also always determined during normal operation and fault operation is identified depending on the recorded space vector voltage. This is also based on the knowledge that the space vector voltage can be recorded more quickly or reflects changes in the line voltage more quickly. During normal operation, the feed-in and also the reactive power feed-in are preferably actually controlled depending on the positive sequence voltage but recording the space vector voltage can run at the same time without it having to influence the control. The space vector voltage, which is thus always determined during normal operation, can then be evaluated as to whether there is a transition to the fault operation. This means that a fault operation can be identified quickly.

According to an embodiment, it is proposed that specifying the reactive current depending on the space vector voltage transitions back to specifying the reactive current depending on the positive sequence voltage if the positive sequence voltage has essentially assumed a stationary value and/or if changes in the positive sequence voltage are below a predeterminable limit gradient in terms of magnitude. The positive sequence voltage is thus further recorded during the fault operation, which is also proposed as a possible feature for the other embodiments. In particular, the positive sequence voltage is further recorded regardless of whether normal operation or fault operation is present. If there is little change to the positive sequence voltage in terms of magnitude, it can be assumed that normal operation is present or the fault operation is over. In order to assess whether there is only little change to the positive sequence voltage, it is proposed that a limit gradient is provided. This can also be referred to as a limit gradient for changes in the positive sequence voltage. In terms of magnitude, this limit gradient is preferably 3% to 5% of the nominal voltage per period duration.

In this case, it is also taken into account that depending on the sequence the positive sequence voltage has less noise than the space vector voltage, owing to the way it is recorded. The positive sequence voltage is therefore well-suited for being checked on a gradient.

It has also been recognized that changing from normal operation to the fault operation is time critical and is preferably carried out depending on the space vector voltage, which can identify voltage changes more quickly than the positive sequence voltage. At the same time, it has been recognized that changing back to normal operation is less time critical and therefore the positive sequence voltage can be easily used as a criterion.

According to an embodiment, it is therefore proposed that changing from normal operation to the fault operation depends on the space vector voltage, while changing back from the fault operation to normal operation depends on the positive sequence voltage.

According to an embodiment, it is proposed that specifying the reactive current depending on the space vector voltage transitions back to specifying the reactive current depending on the positive sequence voltage if the space vector voltage has reached a minimum value in the event of a voltage drop of one or a plurality of line voltage phases. It is therefore assumed that a network fault is noticeable as a voltage drop or is a voltage drop. Furthermore, it has been recognized that referencing the space vector voltage is only required for a short transition zone. In this case, the space vector voltage also drops quickly and results in a correspondingly increasing reactive current, which is calculated depending on the space vector voltage. Particularly if not all voltage phases are dropping, the space vector voltage can have a curve which oscillates with the line frequency and it is then firstly important to achieve rapid support quickly by way of the reactive power. The reactive power can then be set more precisely and the positive sequence voltage can also be used again for this purpose.

According to a variant, it is proposed that specifying the reactive current depending on the space vector voltage transitions back to specifying the reactive current depending on the positive sequence voltage if a curve of the space vector voltage has reached a turning point. If the voltage phases are no longer symmetrical after a fault, particularly a voltage drop, because, for example, not all voltage phases drop, the space vector voltage can continue to oscillate. An average value of this oscillating space vector voltage can be important for calculating the reactive power and the space vector voltage reaches an average value of this type approximately at its turning point, i.e., when its voltage drop has reached a maximum in terms of magnitude.

According to a variant, it is proposed that specifying the reactive current depending on the space vector voltage transitions back to specifying the reactive current depending on the positive sequence voltage if a predetermined transition period after identifying the fault operation has elapsed.

It has been particularly recognized here that a transition period of this type, which can be in the range of a quarter of a line period, can be precalculated and an even quicker reaction is possible as a result. It is therefore possible to change back to referencing depending on the positive sequence voltage without evaluating the measurements.

According to an embodiment, it is proposed that after changing to the fault operation, specifying the reactive current takes place depending on the space vector voltage, until a switchback criterion has been identified, when the switchback criterion is identified, the reactive current value, which has been calculated depending on the space vector voltage, is held as a space vector reactive current value, after identifying the switchback criterion, a positive sequence reactive current value is continuously calculated depending on the positive sequence voltage, and the predetermined reactive current is calculated by the held space vector reactive current value transitioning to the positive sequence reactive current value over a predeterminable transition curve.

At the start of the fault operation, the reactive current is therefore firstly only calculated depending on the space vector voltage, until the switchback criterion occurs or has been identified. The switchback criterion may be, for example, that the space vector voltage reaches a minimum value in the event of a voltage drop of one or a plurality of line voltage phases, or that a curve of the space vector voltage has reached a turning point, or it can be the expiry of the predetermined transition period.

If this criterion is met, the most recent reactive current value which has been calculated depending on the space vector voltage is effectively frozen. This then transitions over to the reactive current value which is calculated from the positive sequence voltage. This can also be referred to as crossfading and it can take place in the same manner as described in the following in relation to the transition from the positive sequence voltage to the space vector voltage, or vice versa. When transitioning from the space vector reactive current value to the positive sequence reactive current value, the positive sequence reactive current value can still continue to change owing to the ongoing continuous calculation. In particular, the positive sequence reactive current value can still change owing to the fact that the positive sequence voltage is still changing.

According to an embodiment, it is proposed that the fault operation and/or specifying the reactive current is carried out depending on a space vector voltage for a fault period, wherein the fault period is smaller than a line period, in particular being in the range of 5% to 50% of the line period. The fault period can also correspond to the transition period. It has been recognized that the positive sequence voltage is once again a good reference value at the latest after a line period and it should then be changed back to quickly. The fault period for which reference is made to the space vector voltage preferably does not include any crossfade period.

Additionally or alternatively, it is proposed that specifying the reactive current depending on a space vector voltage transitions to specifying the reactive current depending on a positive sequence voltage in a crossfade period, which can also be referred to as crossfading. In this case, it is proposed that the crossfade period is smaller than a line period, in particular being in the range of 20% to 90% of the line period. This is also based on the knowledge that the positive sequence voltage is determined over a line period and thus has a good value after a line period has expired and therefore crossfading to referencing the positive sequence voltage should occur within a line period.

According to an embodiment, it is proposed that when changing to the fault operation, specifying the reactive current depending on the positive sequence voltage transitions to specifying the reactive current depending on the space vector voltage as follows. The reactive current is specified depending on a reference value and the reference value transitions from the positive sequence voltage to the space vector voltage over a predeterminable transition curve. This transition curve can also be referred to as a transition curve of the positive sequence voltage.

This is based on the knowledge that a quick transition of the reactive current from the one dependence to the other dependence is indeed important, but an abrupt transition can be critical and is to be avoided. It is therefore proposed that the reactive current is specified depending on a reference value. In this respect, the reference value is an artificial value which transitions from the current value of the positive sequence voltage to the current value of the space vector voltage, in particular within a transition period. The input variable for specifying the reactive current therefore no longer changes abruptly, but instead can transition particularly continuously and over a predeterminable transition curve.

A preferred option is that the predeterminable transition curve is linear. Consequently, the value of the positive sequence voltage can transition to the value of the space vector voltage in a linear manner, i.e., along a straight line, in a temporal representation over a predetermined change period. In this temporal representation, the value of the positive sequence voltage would thus be connected to the value of the space vector voltage over a straight line in an illustrative manner. The reference value then moves along this straight line over this change period depending on the time.

If the value of the positive sequence voltage and/or the value of the space vector voltage were to change during this change period, the linear transition curve can follow this. Referring to the illustrative example of the connection by means of a straight line, the two end points of the positive sequence voltage and the straight line connecting the space vector voltage can thus move.

Additionally or alternatively, it is proposed that the predeterminable transition curve is realized by the fact that the reference value is made up of a positive sequence voltage with a first weighting and a space vector voltage with a second weighting and the first weighting decreases with time, while the second weighting increases with time. In particular, it is proposed that the first weighting decreases with time from 1 to 0, while the second weighting increases with time from 0 to 1. In particular, the reference value can be an average value between the weighted positive sequence voltage and the weighted space vector voltage. If the first weighting decreases from 1 to 0, while the second weighting simultaneously increases from 0 to 1, this results in a linear transition curve. This proposed use of a first and second weighting makes it possible to also take into account a change in the positive sequence voltage and/or the space vector voltage, which change occurs during the transition period, in a simple manner. This first and second weighting can also be referred to as a first and second weighting of the transition of the positive sequence voltage.

According to an embodiment, it is proposed that specifying the reactive current depending on the space vector voltage transitions back to specifying the reactive current depending on the positive sequence voltage as follows. The reactive current can be specified depending on a reference value, wherein the reference value transitions from the space vector voltage to the positive sequence voltage over a predeterminable transition curve. It is therefore proposed that the change of dependence of the reactive current from the space vector voltage back to the positive sequence voltage takes place over a predeterminable transition curve. This transition curve can also be referred to as a transition curve of the space vector voltage. Variants of the implementation take place in the same manner as has been described previously in relation to the embodiment, which variants describe how the reactive current changes in its dependence from the positive sequence voltage to the space vector voltage.

In particular, when changing the reactive current from depending on the space vector voltage back to depending on the positive sequence voltage, it is also proposed that the predeterminable transition curve is linear. Additionally or alternatively, it is proposed that the predeterminable transition curve is realized by the fact that the reference value is made up of a positive sequence voltage with a first weighting and a space vector voltage with a second weighting and the first weighting increases with time, in particular from 0 to 1, while the second weighting decreases, in particular from 1 to 0. Switching the dependence of the reactive current from the fault operation back to normal operation can thus also be carried out without a jump. This first and second weighting can also be referred to as a first and second weighting of the transition of the space vector voltage.

Instead of transitioning the reference value from the positive sequence voltage to the space vector voltage or vice versa from the space vector voltage back to the positive sequence voltage as an indirect method, two reactive currents can also be calculated and the predetermined reactive current can then switch from one reactive current to the other as a direct method.

It is therefore preferably proposed that when changing to the fault operation, specifying the reactive current depending on the positive sequence voltage transitions to specifying the reactive current depending on the space vector voltage according to a predeterminable transition curve, in particular so that a positive sequence reactive current is calculated as a reactive current depending on the positive sequence voltage, a space vector reactive current is calculated as a reactive current depending on the space vector voltage and a predetermined reactive current transitions from the positive sequence reactive current according to a predeterminable transition curve to the space vector reactive current, and in particular the predeterminable transition curve is linear, and/or the predeterminable change sequence is realized by the fact that the predetermined reactive current is made up additively of the positive sequence reactive current with a first weighting and the space vector reactive current with a second weighting and the first weighting decreases with time, in particular from 1 to 0, while the second weighting increases, in particular from 0 to 1. This transition curve can also be referred to as a transition curve of the positive sequence reactive current. This first and second weighting can also be referred to as a first and second weighting of the transition of the positive sequence reactive current.

Additionally or alternatively, it is proposed that specifying the reactive current depending on the space vector voltage transitions back to specifying the reactive current depending on the positive sequence voltage by the fact that the predetermined reactive current transitions from the space vector reactive current according to a predeterminable transition curve back to the positive sequence reactive current, and in particular the predeterminable transition curve is linear, and/or the predeterminable transition curve is realized by the fact that the predetermined reactive current is made up additively of the positive sequence reactive current with a first weighting and the space vector reactive current with a second weighting and the first weighting increases with time, in particular from 0 to 1, while the second weighting decreases, in particular from 1 to 0. This transition curve can also be referred to as a transition curve of the space vector reactive current. This first and second weighting can also be referred to as a first and second weighting of the transition of the space vector reactive current.

The explanations for the direct method shall also apply accordingly to the indirect method. Weightings can be used and specified in this direct method in the same manner as the weightings in the indirect method. The predeterminable transition curve can also be fundamentally the same in both methods, taking into account any adjustment to the physical unit, of course.

According to an embodiment, it is proposed that when interrupting a measurement of the line voltage, the space vector voltage is estimated by a rotating voltage vector. For this purpose, it is proposed that the rotating voltage vector is calculated depending on a value of the space vector voltage before the interruption of the measurement of the line voltage, and that it continues to be calculated depending on a nominal frequency of the line voltage and/or depending on a most recently recorded frequency of the line voltage. In particular, it is proposed that the voltage vector assumes the value of the space vector voltage in terms of magnitude and phase before the interruption of the measurement of the line voltage and rotates continuously with an angular frequency corresponding to the nominal frequency or corresponding to the most recently recorded frequency of the line frequency. The voltage vector therefore rotates with the angular frequency $\omega$ and this angular frequency is calculated as $\omega=2*\pi*f_N$ or as $\omega=2\pi*f$, wherein $f_N$ stands for the nominal frequency of the line voltage and f for the most recently recorded frequency of the line voltage, which can also be referred to as a line frequency.

This is particularly based on the knowledge that by using this voltage vector, a voltage reference in terms of magnitude and phase can be provided at least temporarily, even in the event of the interruption of a measurement of the line voltage, which voltage reference makes it possible to continue a feed-in, in particular continue a reactive power feed-in. Interrupting the measurement of the line voltage may also be justified by the line voltage actually collapsing or at least dropping temporarily or for a short period, which is in particular less than one second. In this case, it can be useful to nevertheless feed reactive power into the electrical supply network, in order to ensure network support.

It is proposed that the current to be fed in, and thus also the reactive current to be fed in, is specified and fed in according to the tolerance band method. In the tolerance band method, the generated current is measured, this measurement or the measured value is fed back and the current is generated depending on this. This means that a desired current can be set and generated, even if the line voltage is fluctuating or even dropping. This is therefore particularly preferably proposed in the event of an interruption of a measurement of the line voltage if the space vector voltage is estimated by a rotating voltage vector. However, the tolerance band method can also be used permanently for controlling the current to be fed in, i.e., also during normal operation.

In particular, it is proposed that there is a change from normal operation to a fault operation depending on a voltage change in the line voltage. In this case, for feeding the reactive current depending on the positive sequence voltage, there is a change to feeding the reactive current depending on a space vector voltage. For feeding the reactive current, there is thus a change from referencing the positive sequence voltage to referencing the space vector voltage. This change can also be regarded as a first step with which the reactive current can react quickly to voltage changes, in order to achieve voltage stabilization in the electrical supply network as a result.

If then additionally the line voltage drops and/or a measurement of the line voltage is interrupted, the space vector voltage can additionally be estimated depending on a rotating voltage vector. The reactive power feed-in then references this rotating voltage vector. This switch of referencing the rotating voltage vector can thus be regarded as a second step. This makes it possible to navigate through a line voltage fault quickly in an advantageous manner, in particular by means of the first and second step combined.

A wind power installation for feeding electrical power into the electrical, three-phase supply network is also proposed. The wind power installation has an inverter device for this purpose. In addition, the wind power installation has a controller, and the wind power installation is set up to carry out the feed-in by means of a method according to at least one embodiment described previously. In particular, the corresponding method steps can be implemented in the controller for this purpose. The controller is then therefore set up to carry out the feed-in according to at least one method explained previously.

In particular, measurement sensors are provided in the wind power installation or in the access to the wind power installation, which measurement sensors record a line voltage in three phases. A positive sequence voltage and also a negative sequence voltage as well as a space vector voltage can be determined therefrom. The positive sequence voltage or the space vector voltage can in particular be used as an input variable for feeding the reactive power. The positive sequence voltage, the negative sequence voltage and the space vector voltage can be determined by means of the controller. The controller can also evaluate these voltage values and change between the positive sequence voltage and the space vector voltage as an input variable to start the reactive power. The controller can also control a transition for changing between the positive sequence voltage and the space vector voltage, or vice versa.

BRIEF DESCRIPTION OF THE SEVERAL VIEWS OF THE DRAWINGS

The disclosure is explained in greater detail hereinafter by way of example using embodiments with reference to the attached figures.

DETAILED DESCRIPTION

Figure 1:
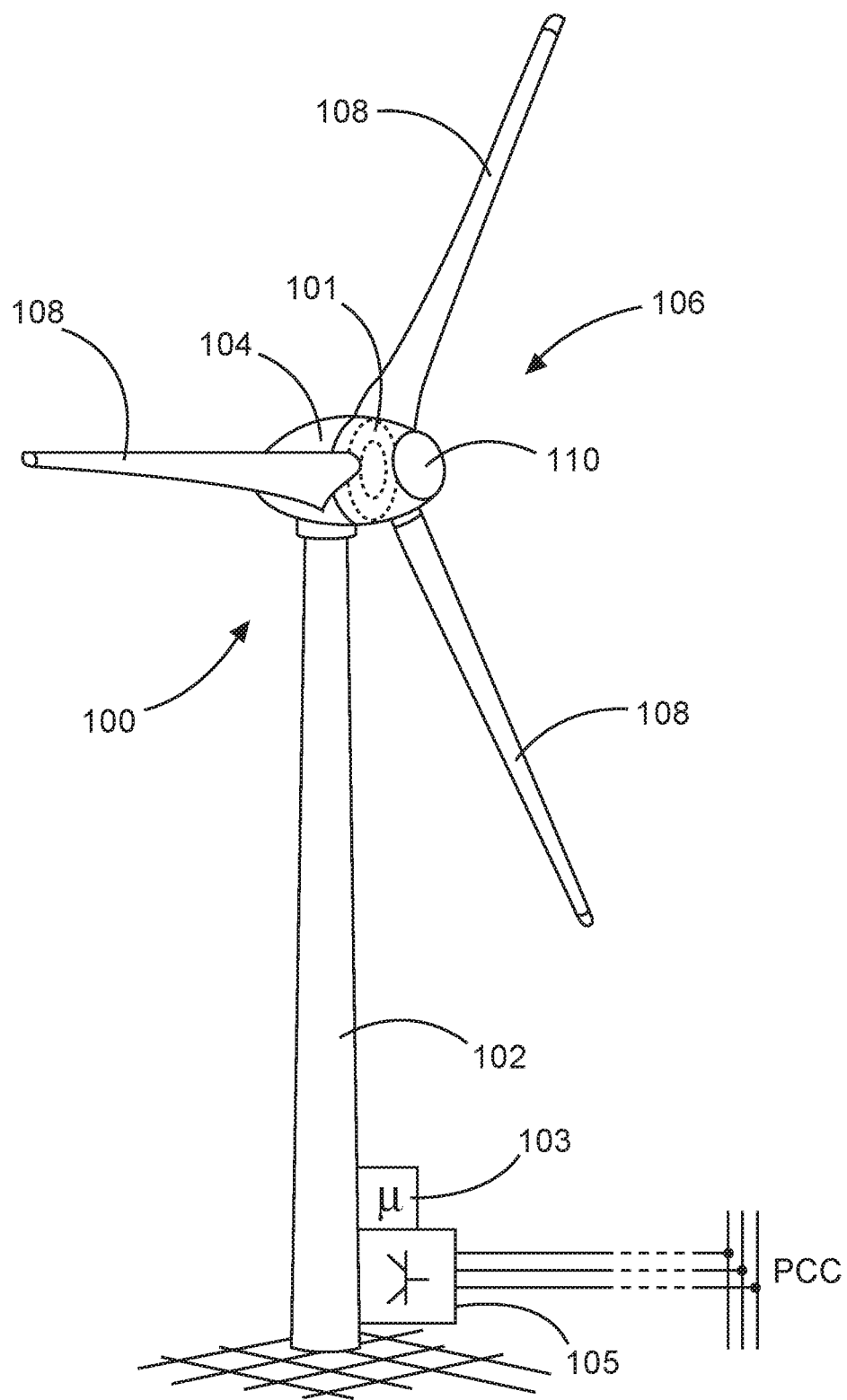
FIG. 1 shows a perspective representation of a wind power installation.

FIG. 1 shows a wind power installation 100 having a tower 102 and a nacelle 104. A rotor 106 with three rotor blades 108 and a spinner 110 is arranged on the nacelle 104. The rotor 106 is transferred into a rotational movement by the wind during operation and thus drives a generator in the nacelle 104.

The wind power installation 100 has an electrical generator 101 which is indicated in the nacelle 104. Electrical power can be generated by means of the generator 101. A feed-in unit 105 is provided for feeding electrical power, which feed-in unit can in particular be designed as an inverter. This makes it possible to generate a three-phase feed-in current and/or a three-phase feed-in voltage according to amplitude, frequency and phase, for feeding in at a network connection point PCC. This can take place directly or also together with other wind power installations in a wind park. A system control 103 is provided for controlling the wind power installation 100 and also the feed-in unit 105. The system control 103 can also include external default values, in particular from a central park computer.

Figure 2:
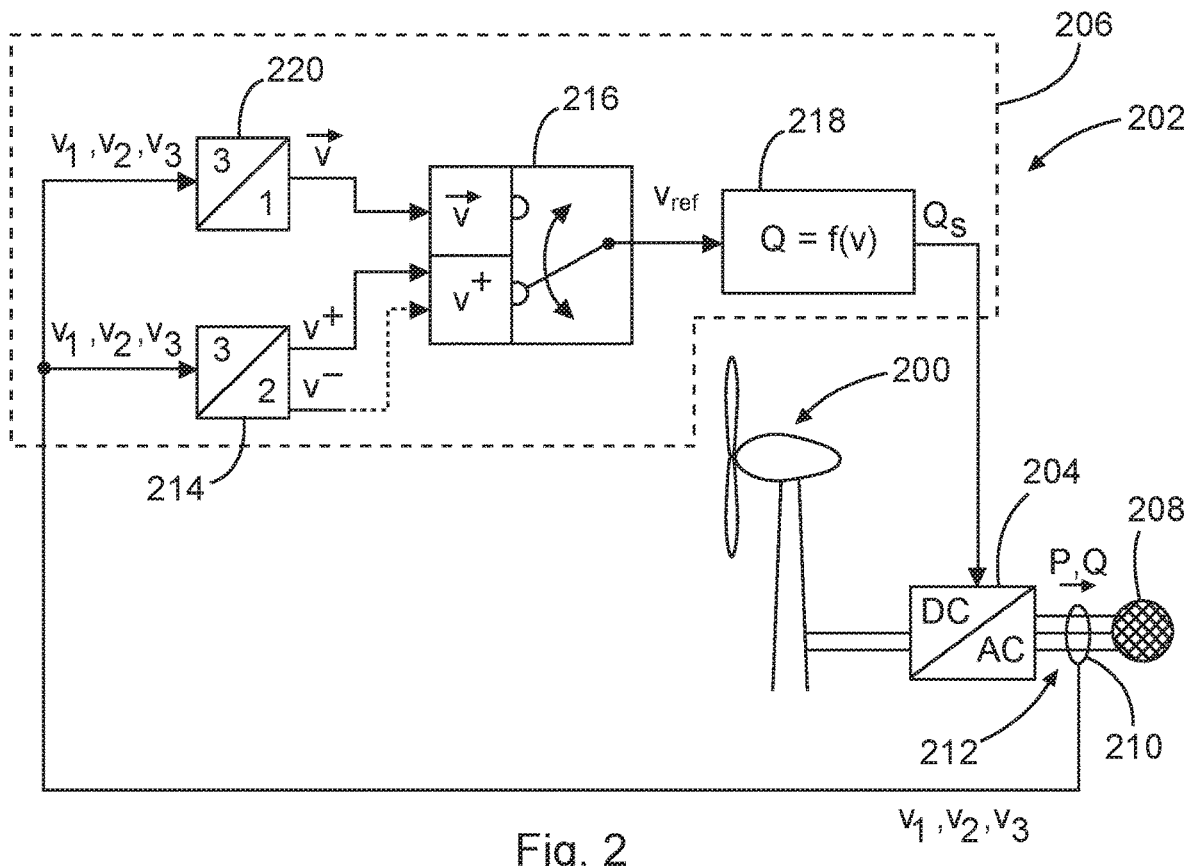
FIG. 2 shows a schematic control structure.

FIG. 2 shows a schematic control structure 202 which controls an inverter 204 of a wind power installation 200. The wind power installation 200 can correspond to the wind power installation 100 from FIG. 1. The wind power installation 200 is to be understood particularly schematically and it can include the controller structure 202 or its elements. The controller structure 202 can be included or implemented in a controller 206. The inverter 204 can feed active power P and reactive power Q into an electrical supply network 208.

According to an embodiment, the proposed method works in such a way that the three voltage phases $v_1$, $v_2$ and $v_3$ of the electrical supply network 208 are measured. This can take place by means of the measuring sensor 210 in the electrical supply network 208 or, as represented in FIG. 2, at a connecting line 212 between the inverter 204 and the electrical supply network 208.

During normal operation, these 3 phase voltages are disassembled or transformed into a positive sequence voltage $v^+$ and a negative sequence voltage $v^-$ in a disassembly block 214 according to the method of the symmetrical components. This positive sequence voltage $v^+$ is fed into the changing block 216. The negative sequence voltage $v^-$ can optionally also be fed into this changing block 216, which is indicated by a correspondingly dotted arrow.

In the changing block 216, this positive sequence voltage $v^+$ can be selected as a voltage which is to be used for determining the reactive power. This is indicated in the changing block 216 by a corresponding switch position. The changing block 216 then outputs the voltage which is to be used for controlling the reactive power as a reference value or reference voltage $v_{ref}$.

The switch position of the changing block 216 indicated in FIG. 2 thus relates to normal operation in which the reactive power control depends on the positive sequence voltage $v^+$. The reference voltage $v_{ref}$ therefore corresponds to the positive sequence voltage $v^+$.

For further implementation, this reference voltage $v_{ref}$ is fed into the reactive power block 218 as an input variable. In the reactive power block 218, a desired reactive power is calculated as a function depending on the input variable of the reactive power block 218, i.e., depending on the reference voltage $v_{ref}$, and is output as a nominal reactive power $Q_s$. This nominal reactive power $Q_s$ then forms an input value for the inverter 204. In this respect, this reactive power nominal value $Q_s$ forms a reference variable for controlling the inverter.

In order to control the inverter 204, even more variables are required which, however, are not represented here for the sake of simplicity. The inverter 204 can be supplied with energy by way of a direct voltage on the input side. It can obtain a direct voltage of this type from a generator of the wind power installation 200, for example, which generates an alternating current which is rectified.

In the event that normal operation must or should be left and a fault operation is to be used, the three phase voltages $v_1, v_2, v_3$ are transformed into a space vector voltage $\vec{v}$ in the transformation block 220. This space vector voltage $\vec{v}$ is also fed into the changing block 216. The changing block 216 can change to this space vector voltage $\vec{v}$ as an input variable for the reactive power control if required, i.e., in particular during fault operation, by way of the indicated switch. However, in this respect, the switch indicated in the changing block 216 only serves to illustrate. In fact, it is proposed not to switch rigidly between the positive sequence voltage $v^+$ and the space vector voltage $\vec{v}$, but instead to change by means of a transition function. This is explained in greater detail further on in an exemplary manner and any preceding or subsequent explanations for changing can be implemented in this changing block 216.

Figure 3:
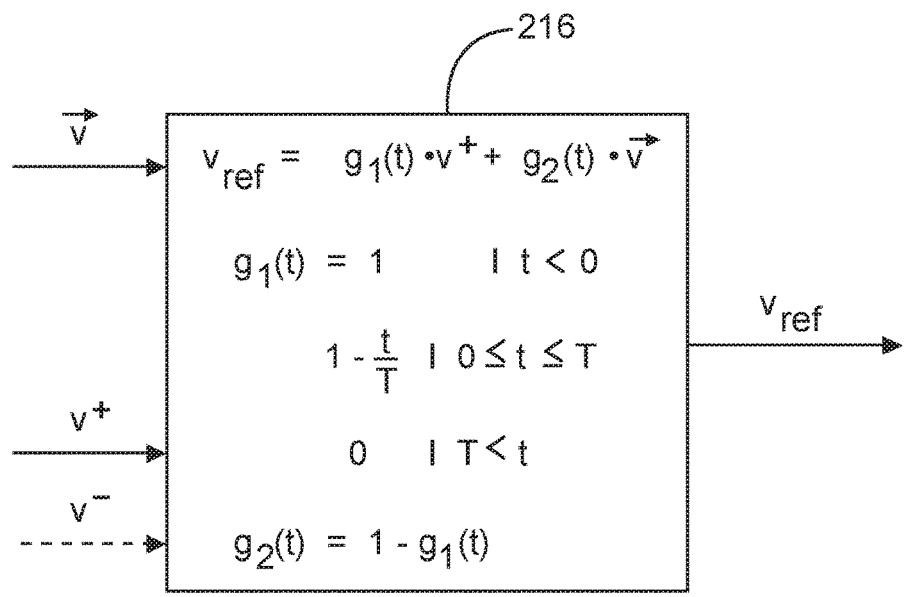
FIG. 3 shows an element of the control structure from FIG. 2.

One possible realization of the changing block 216 is represented in FIG. 3. A linear change of the reference voltage $v_{ref}$ from the positive sequence voltage $v^+$ to the space vector voltage $\vec{v}$ is implemented there by way of the weighting functions $g_1(t)$ and $g_2(t)$ as a mathematical function. The first weighting function $g_1(t)$ thus drops linearly from 1 to 0 over the transition period T, so that the portion of the positive sequence voltage $v^+$ drops from the maximum value to 0 over this transition period. At the same time, the weighting function $g_2(t)$ increases from 0 to 1 over the transition period T, so that the portion of the space vector voltage increases from 0 to the maximum value over the transition period.

Correspondingly, the same mathematical context can be implemented even if the reference voltage $v_{ref}$ is to change back from the space vector voltage $\vec{v}$ to the positive sequence voltage $v^+$, wherein the weighting functions $g_1(t)$ and $g_2(t)$ would have to be exchanged. However, a shorter or longer transition period can also be used for changing back, to point out an example of a variation.

Figure 4:
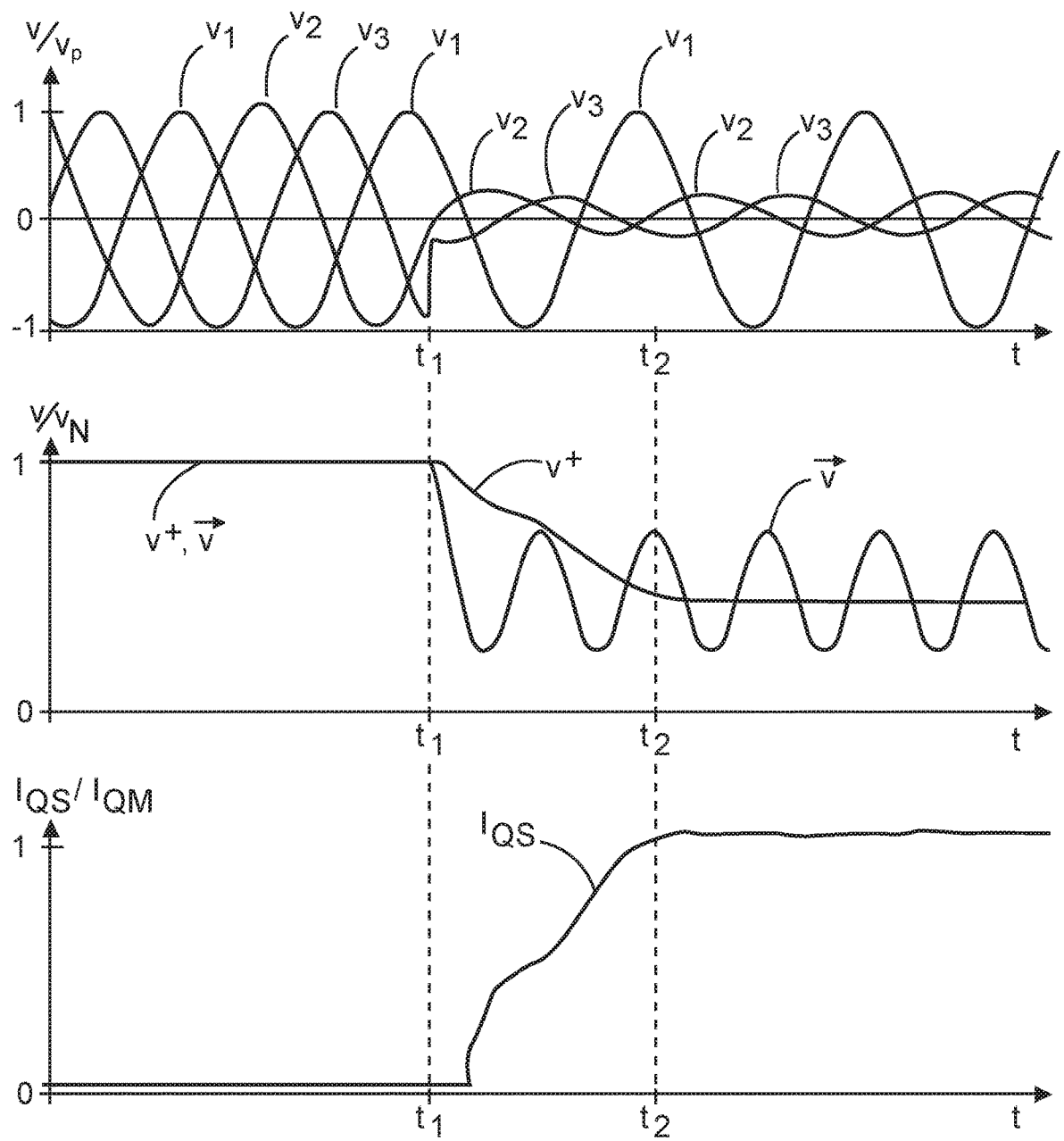
FIGS. 4 and 5 each show diagrams of voltage curves and in each case a reactive current curve calculated therefrom in different manners.

FIG. 4 shows a feed-in of the reactive current in the positive and negative sequence. Since it is not possible to determine the positive and negative sequence voltages immediately, but rather over the duration of a period of the line voltage, the increase in the reactive current feed-in derived therefrom can only take place "slowly". This is illustrated in FIG. 4.

FIG. 4 includes three individual diagrams, of which the top diagram shows the curve of the three measured phase voltages $v_1$, $v_2$ and $v_3$, namely the curve of the instantaneous values. At the time $t_1$, the two phase voltages $v_2$ and $v_3$ drop to a low value.

The middle diagram shows the positive sequence voltage $v^+$ and the space vector voltage $\vec{v}$, which have been calculated from the three phase voltages $v_1$, $v_2$ and $v_3$ and in the diagram are represented standardized to the nominal voltage $V_N$. It can be recognized that the positive sequence voltage $v^+$ and the space vector voltage $\vec{v}$ are approximately the same before the voltage drop at the time $t_1$, in any case they cannot be distinguished in the diagram. The three phase voltages $v_1$, $v_2$ and $v_3$ are thus still approximately symmetrical to one another. After the voltage drop, the space vector voltage $\vec{v}$ changes more quickly and the voltage drop can be identified therefrom more quickly as a result. In principle, the space vector voltage $\vec{v}$ nevertheless maintains a vibration.

The positive sequence voltage $v^+$ reacts more slowly to the voltage drop and reaches a new value after a period T, namely at the time $t_2$.

The bottom diagram from FIG. 4 shows a reactive current determined from the positive sequence voltage $v^+$ for feeding a reactive power, which is referred to as a nominal reactive current $I_{QS}$. The nominal reactive current $I_{QS}$ thus also only reaches a new value after a period T, i.e., at the time $t_2$. The bottom diagram from FIG. 4, the same applies to FIG. 5, assumes by way of illustration that the nominal reactive current reaches a maximum reactive current km to which the diagram is standardized.

Figure 5:
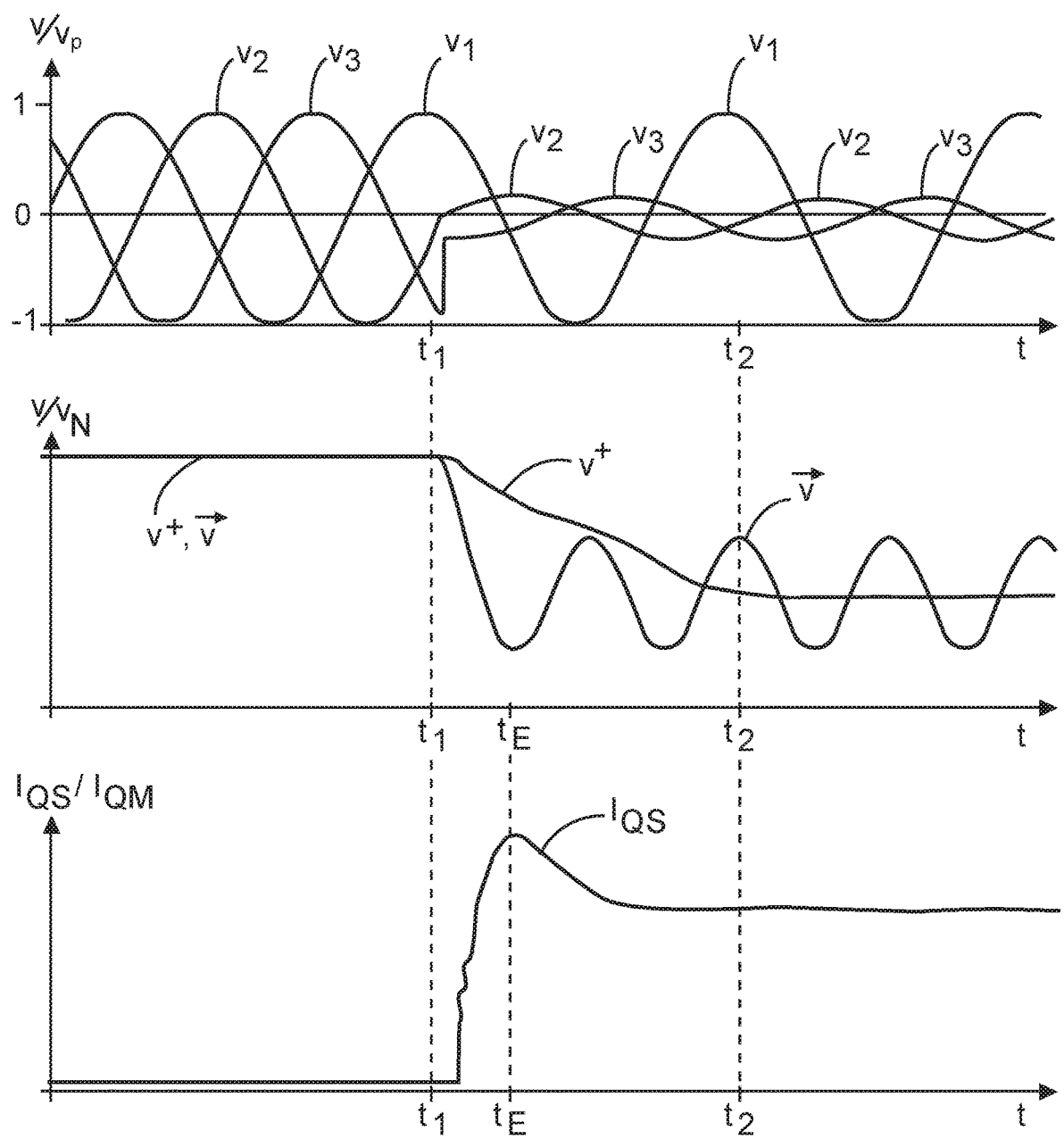

In order to be able to provide the reactive current more quickly, a variant is proposed which is illustrated in FIG. 5. FIG. 5 shows three diagrams and the top and middle diagram correspond to the top and middle diagram from FIG. 4, apart from deviations in the temporal resolution, which are not important here. The embodiments from FIG. 4 are thus referred to for explaining the top and middle diagram from FIG. 5.

The calculation of the reactive current nevertheless differs between FIGS. 4 and 5. The bottom diagram therefore shows a calculated nominal reactive current $I_{QS}$, as in the bottom diagram from FIG. 4, but with the nominal reactive current $I_{QS}$ being calculated in a different manner.

It is proposed that providing the initial reactive current, namely initially from a detected fault criterion, is carried out using the measured space vector voltage $\vec{v}$. The fault criterion in the example shown in FIG. 5 is the voltage drop of the two phase voltages $v_2$ and $v_3$ to a low value. This initial reactive current provision therefore takes place from the time $t_1$.

The initial reactive current provision, i.e., determining the nominal reactive current, therefore takes place from the time $t_1$ using the measured space vector voltage $\vec{v}$. As soon as the first minimum in the space vector voltage $\vec{v}$ has been identified, the nominal value thus obtained is frozen. This is somewhat the case at the time $t_E$. It is then possible to crossfade from the space-vector-based nominal value to the positive-sequence-based nominal value over a period of 15 ms. The period of 15 ms is somewhat smaller than a period T, which is 20 ms here, since it is based on a 50 Hz network.

It has been recognized that it can be useful to carry out a quicker feed-in of reactive current in the case of an error, which can also be referred to as a fault, namely within the first 10 ms if possible.

One or more embodiments makes it possible to provide a reactive current for network support more quickly than is known to date where the reactive power is fed exclusively based on the positive sequence voltage. A higher network stability can also be achieved as a result.

It is thus proposed to identify an error with a space vector voltage and then correspondingly switch to a space vector voltage for referencing. This is quicker than referencing the positive sequence. If the sequence is levelled out, it is possible to switch back to referencing the positive sequence.

One known problem involves finding a good transition from referencing the positive sequence to referencing the space vector voltage and back. A crossfade is proposed for this purpose.

Crossfading from referencing the space vector voltage to referencing the positive sequence, i.e., the positive sequence voltage, can start at the minimum of the space vector voltage. Other possibilities are also considered, such as only referencing the space vector voltage for a predetermined time, for example. A predetermined time of this type can be a quarter of a line period, for example. It is also possible to evaluate the space vector voltage and to reference the space vector voltage until it has a turning point, and then to change to referencing the positive sequence voltage. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for feeding electrical power into an electrical, three-phase supply network by an inverter device, wherein the electrical supply network has a three-phase line voltage with first, second, and third line voltage phases, the method comprising:
feeding the electrical power during normal operation if a fault-free operation has been identified for the electrical supply network, wherein during normal operation:
a positive sequence voltage is recorded from the line voltage, and
a reactive current is specified at least depending on the positive sequence voltage; and
changing to a fault operation if a voltage change in the line voltage meets a predetermined fault criterion, wherein during the fault operation, at least directly after the change, the reactive current is specified depending on a space vector voltage,
wherein the space vector voltage is defined by the equation:

$$\vec{v} = \left[ v_1 + v_2 \exp\left(j\frac{2}{3}\pi\right) + v_3 \exp\left(j\frac{4}{3}\pi\right) \right],$$

wherein with $v_1$, $v_2$, and $v_3$ each have an instantaneous value, and
wherein the predetermined fault criterion is met when the voltage change exceeds a predeterminable minimum amount of change or a minimum amount of change gradient.

2. The method as claimed in claim 1, wherein the instantaneous values of $v_1$, $v_2$, and $v_3$ are instantaneous measured values of the first, second, and third line voltage phases, respectively.

3. The method as claimed in claim 1, wherein the space vector voltage is determined during normal operation and, depending on the recorded space vector voltage, a switch is made to the fault operation.

4. The method as claimed in claim 1, wherein:
specifying the reactive current depending on the space vector voltage transitions back to
specifying the reactive current depending on the positive sequence voltage,
if the positive sequence voltage has essentially assumed a stationary value or if changes in the positive sequence voltage are below a predeterminable limit gradient in terms of magnitude,
if the space vector voltage has reached a minimum value in the event of a voltage drop of one or a plurality of line voltage phases, and/or
if a curve of the space vector voltage has reached a turning point, and/or
if a predetermined transition period after identifying the fault operation has elapsed.

5. The method as claimed in claim 1, wherein:
after changing to the fault operation, specifying the reactive current takes place depending on the space vector voltage, until a switchback criterion has been identified,
when the switchback criterion is identified, the reactive current value, which has been calculated depending on the space vector voltage, is held as a space vector reactive current value,
after identifying the switchback criterion, a positive sequence reactive current value is continuously calculated depending on the positive sequence voltage, and
the predetermined reactive current is calculated by a held space vector reactive current value transitioning to the positive sequence reactive current value over a predeterminable transition curve.

6. The method as claimed in claim 1, wherein:
at least one of changing to the fault operation or specifying the reactive current is carried out depending on a space vector voltage for a fault period, wherein the fault period is less than a line period.

7. The method as claimed in claim 6, wherein the fault period is 5% to 50% less than the line period.

8. The method as claimed in claim 1, wherein specifying the reactive current depending on a space vector voltage transitions to specifying the reactive current depending on a positive sequence voltage in a crossfade period.

9. The method as claimed in claim 8, wherein the crossfade period is less than a line period.

10. The method as claimed in claim 8, wherein the crossfade period is between 20% to 90% the line period.

11. The method as claimed in claim 1, wherein when changing to the fault operation, the method comprises:
specifying the reactive current depending on the positive sequence voltage changes to
specifying the reactive current depending on the space vector voltage by the fact that
the reactive current is specified depending on a reference value and the reference value transitions from the positive sequence voltage to the space vector voltage over a predeterminable transition curve, wherein:
the predeterminable transition curve is linear, and
the predeterminable transition curve is realized by the fact that the reference value is made up of a positive sequence voltage with a first weighting and a space vector voltage with a second weighting, and wherein the first weighting decreases with time, while the second weighting increases, wherein:
specifying the reactive current depending on the space vector voltage transitions back to
specifying the reactive current depending on the positive sequence voltage by the fact that
the reactive current is specified depending on a reference value and the reference value transitions from the space vector voltage to the positive sequence voltage over a predeterminable transition curve, wherein:
the predeterminable transition curve is linear, and
the predeterminable transition curve is realized by the fact that the reference value is made up of a positive sequence voltage with a first weighting and a space vector voltage with a second weighting, and wherein the first weighting increases with time, while the second weighting decreases.

12. The method as claimed in claim 1, wherein when changing to the fault operation, the method comprises:
specifying the reactive current depending on the positive sequence voltage transitions to
specifying the reactive current depending on the space vector voltage according to a predeterminable transition curve, wherein:
a positive sequence reactive current is calculated as a reactive current depending on the positive sequence voltage,
a space vector reactive current is calculated as a reactive current depending on the space vector voltage, and
a predetermined reactive current transitions from the positive sequence reactive current according to a predeterminable transition curve to the space vector reactive current, and wherein:
the predeterminable transition curve is linear, and
the predeterminable transition curve is realized by the fact that the predetermined reactive current is made up additively of the positive sequence reactive current with a first weighting and the space vector reactive current with a second weighting and the first weighting decreases with time, while the second weighting increases, wherein:
specifying the reactive current depending on the space vector voltage transitions back to
specifying the reactive current depending on the positive sequence voltage by the fact that
the predetermined reactive current transitions from the space vector reactive current according to a predeterminable transition curve back to the positive sequence reactive current, and wherein:
the predeterminable transition curve is linear, and
the predeterminable transition curve is realized by the fact that the predetermined reactive current is made up additively of the positive sequence reactive current with a first weighting and the space vector reactive current with a second weighting and the first weighting increases with time, while the second weighting decreases.

13. The method as claimed in claim 1, comprising:
interrupting a measurement of the line voltage and estimating the space vector voltage by a rotating voltage vector, and
wherein the rotating voltage vector continues to be calculated depending on a value of the space vector voltage before the interruption of the measurement of the line voltage and depending on a nominal frequency of the line voltage.

14. The method as claimed in claim 1, wherein during normal operation a negative sequence voltage is recorded from the line voltage, and the reactive current is specified depending on the negative sequence voltage.

15. A wind power installation for feeding electrical power into an electrical, three-phase supply network by an inverter device, wherein the electrical supply network has a three-phase line voltage with first, second, and third line voltage phases, the wind power installation comprising:
a controller configured to control the feeding of electrical power into the electrical, three-phase supply network, wherein the feeding comprises:
feeding the electrical power during normal operation if a fault-free operation has been identified for the electrical supply network, wherein during normal operation:
a positive sequence voltage is recorded from the line voltage, and
a reactive current is specified at least depending on the positive sequence voltage,
changing to a fault operation if a voltage change in the line voltage meets a predetermined fault criterion, if the voltage change exceeds a predeterminable minimum amount of change or a minimum amount of change gradient, wherein during the fault operation, at least directly after the change, and
wherein the reactive current is specified depending on a space vector voltage,
wherein the space vector voltage is defined by the equation:

$$\vec{v} = \left[ v_1 + v_2 \exp\left(j\frac{2}{3}\pi\right) + v_3 \exp\left(j\frac{4}{3}\pi\right) \right],$$

wherein with $v_1$, $v_2$, and $v_3$ each have an instantaneous value, and
wherein the predetermined fault criterion is met when the voltage change exceeds a predeterminable minimum amount of change or a minimum amount of change gradient.

16. The wind power installation in claim 15, wherein during normal operation a negative sequence voltage is recorded from the line voltage, and wherein the reactive current is specified depending on the negative sequence voltage.

* * * * *